United States Patent [19]

Curtis

[11] Patent Number: 4,760,536
[45] Date of Patent: Jul. 26, 1988

[54] AUTORANGING FREQUENCY SENSOR

[76] Inventor: Jerald C. Curtis, 10420 NE. Frontage I-25, Wellington, Colo. 80549

[21] Appl. No.: 805,544

[22] Filed: Dec. 6, 1985
(Under 37 CFR 1.47)

[51] Int. Cl.$^4$ ............................................. G06F 15/20
[52] U.S. Cl. ...................................... 364/484; 324/78 D
[58] Field of Search ............. 364/484; 324/78 D, 166; 84/454; 340/171 R; 377/21, 49, 19, 20

[56] References Cited

U.S. PATENT DOCUMENTS

| | | | |
|---|---|---|---|
| 4,216,463 | 8/1980 | Backof et al. | 324/78 D |
| 4,310,800 | 1/1982 | Baker et al. | 364/484 |
| 4,420,809 | 12/1983 | Pierce | 364/484 |

FOREIGN PATENT DOCUMENTS

| | | |
|---|---|---|
| 1320503 | 6/1973 | United Kingdom . |
| 1449677 | 9/1976 | United Kingdom . |
| 1474982 | 5/1977 | United Kingdom . |

Primary Examiner—Emanuel S. Kemeny
Attorney, Agent, or Firm—Leydig, Voit & Mayer, Ltd.

[57] ABSTRACT

A signaling method and apparatus is described for obtaining a compact but high-resolution and wide-range digital representation of the frequency or period of an input signal. A reference frequency is counted over a number of cycles of the input signal by a counter having a nonlinear response so that the digital representation provided by the counter's value has a relatively high resolution over a wide range. The nonlinear response is provided by selectively dividing the reference frequency in response to the counter's value to obtain a clocking signal for the counter. A minimum resolution is preferably insured by requiring the counter to register a predetermined minimum number of counts before a frequency-indicating value is sampled by a latch. A predetermined function is applied to the sampled value to obtain the approximate number of counts that the counter would have registered but for the selective division of the reference frequency. The relative frequency of the input signal is equal to the number of cycles of the input frequency over which counting occurs divided by the number of counts that the counter would have registered. The adjustment of the frequency-indicating value can be performed by a computer and is considerably simplified by providing a counter counting in base-two scientific notation. The frequency sensor can be used for speed sensing or control of engines or turbines.

28 Claims, 9 Drawing Sheets

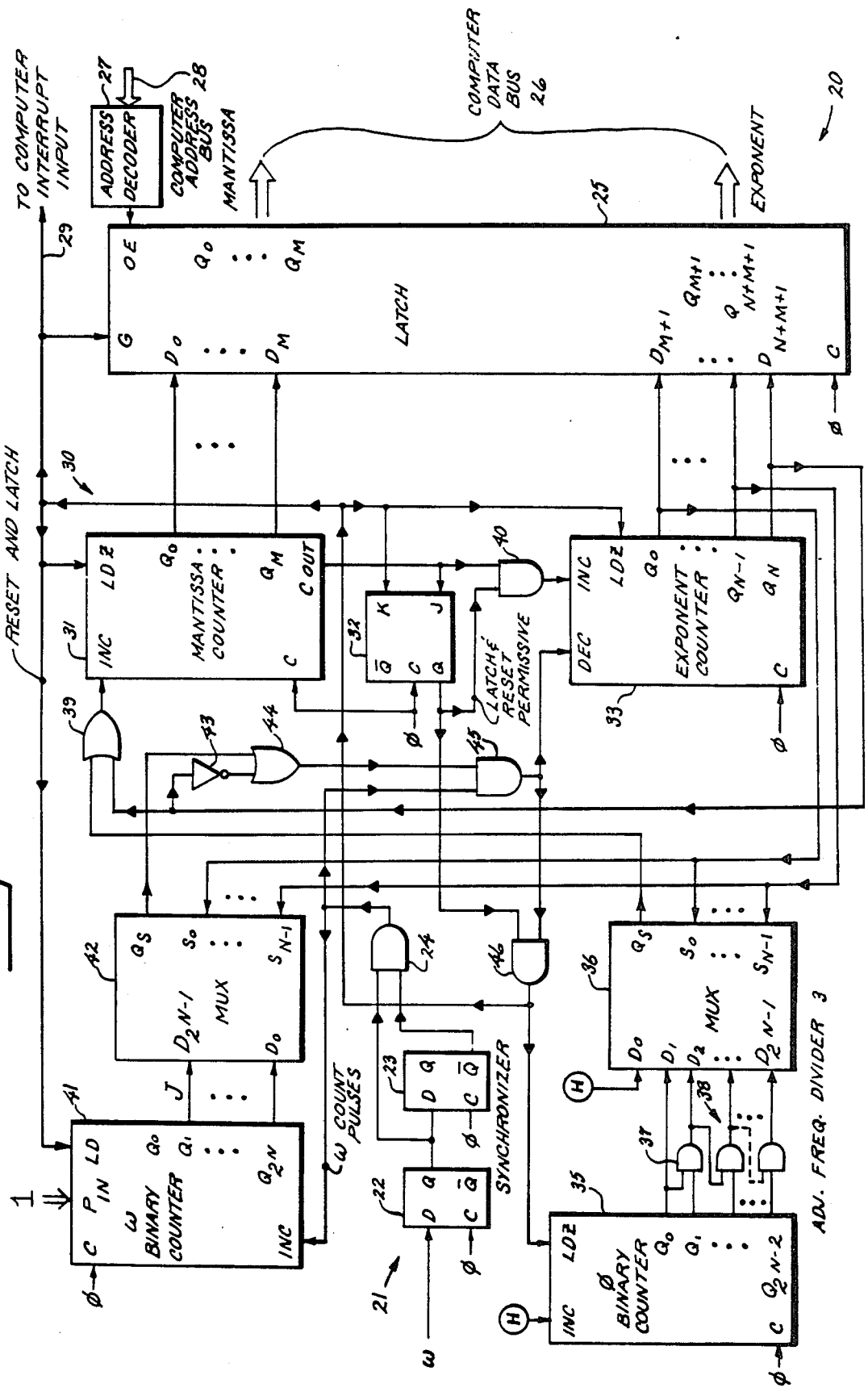

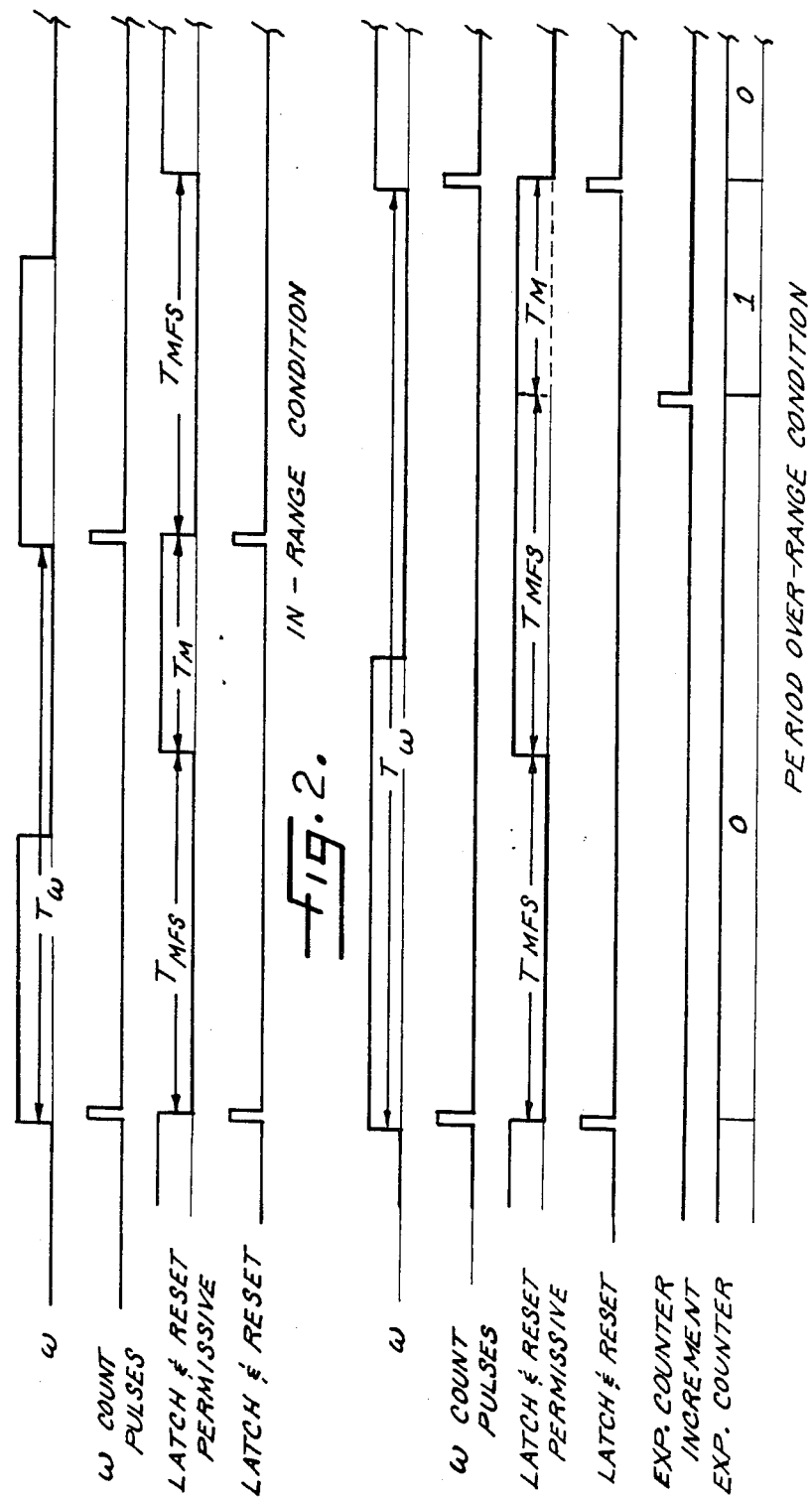

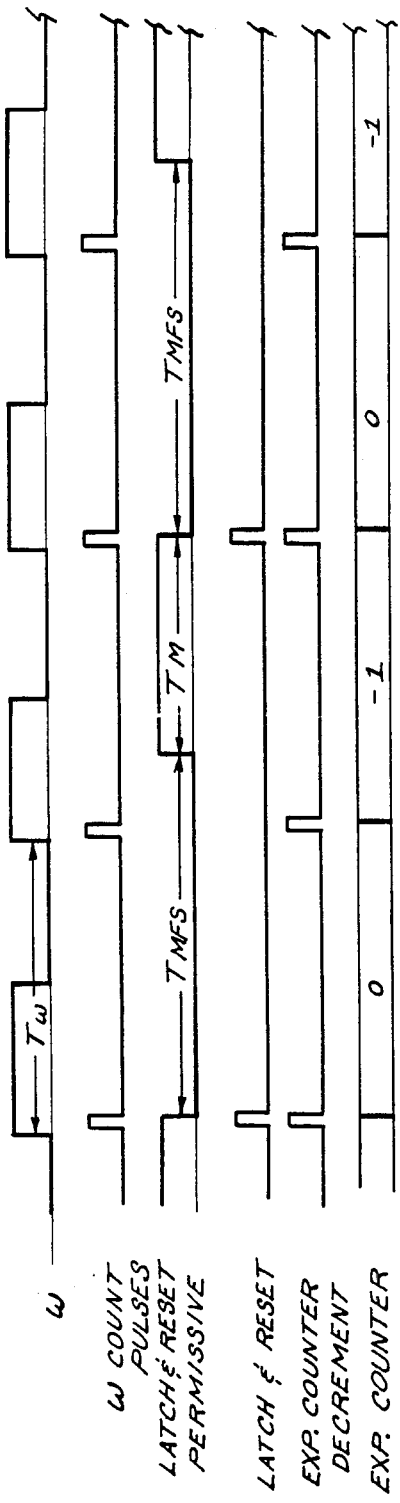
Fig. 4. PERIOD UNDER-RANGE CONDITION
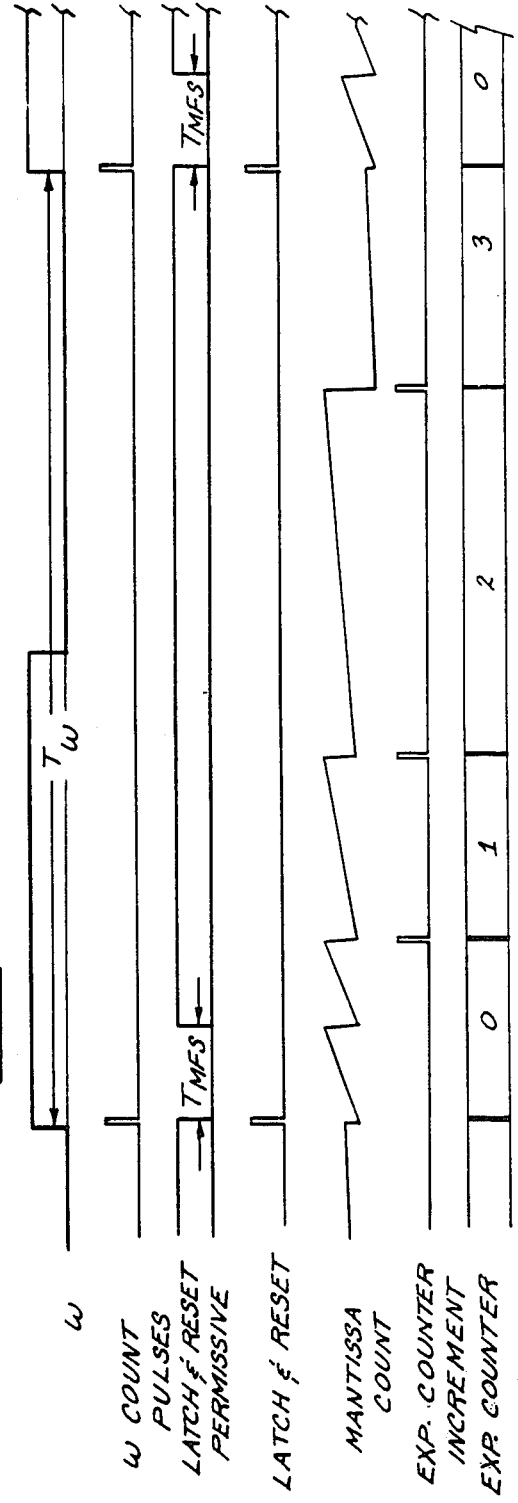
Fig. 5. EXTREME PERIOD OVER-RANGE CONDITION ¼ SCALE

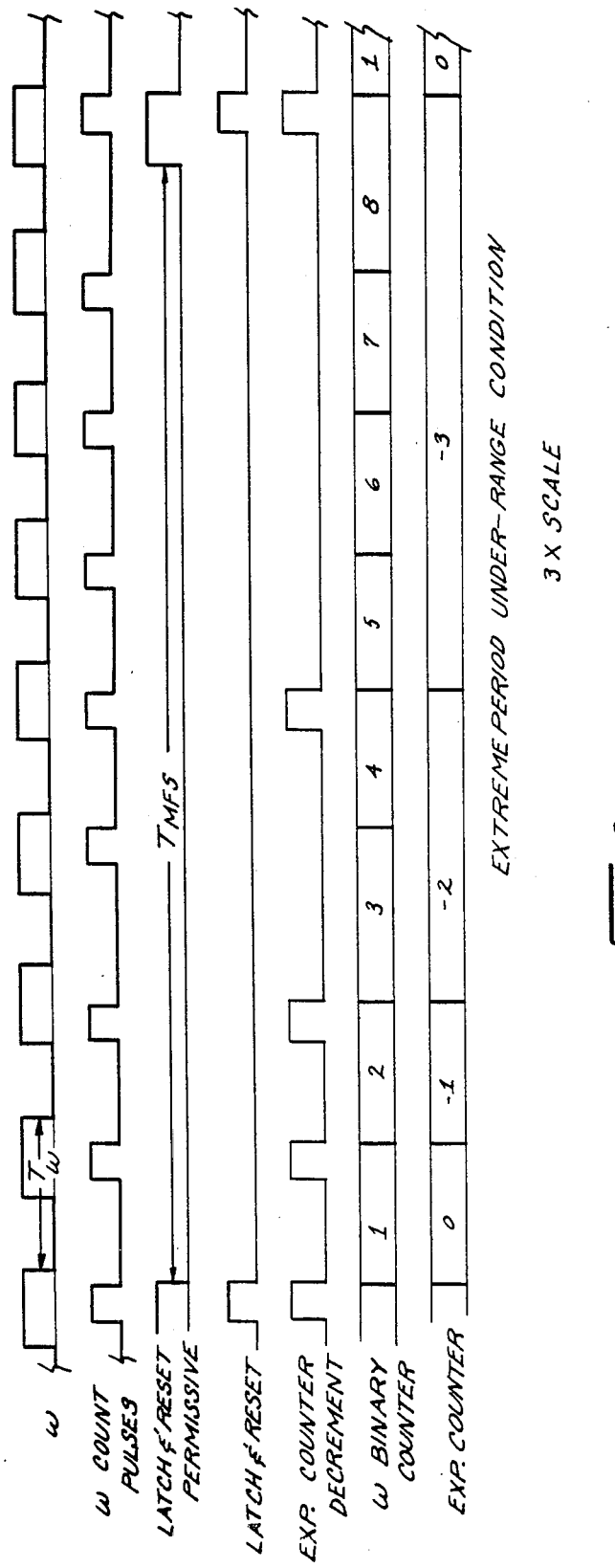

AUTORANGING FREQUENCY SENSOR

BACKGROUND OF THE INVENTION

1. Technical Field

The present invention relates generally to electronic instrumentation and interfaces for computers. More particularly, the invention pertains to a circuit for obtaining a digital representation of the frequency of an input signal. In one specific application, the invention relates to a method and apparatus for digitally signaling the speed of an engine or turbine over a wide range of speed using a compact but high-resolution digital representation.

2. Description of the Related Art

It is well known to obtain a digital representation of the frequency of an input signal by counting the number of cycles in the input signal over a predetermined counting interval. Also, it is known to obtain a digital representation of the frequency of an input signal by counting the number of cycles of a reference signal occurring within one or more cycles of the input signal, and multiplying the known frequency of the reference signal by the ratio of the number of cycles of the input signal and the counted number of cycles in the reference signal.

Cording and Teager, U.S. Pat. No. 4,485,452 issued Nov. 27, 1984 and titled "Speed Measurement System" describes a method of measuring the speed of a rotating element over an extended range by counting both the cycles of an input signal from a speed sensor and the cycles of a reference signal over a counting interval that is asynchronous to the reference signal. The counted number of cycles of the input signal is divided by the counted number of cycles of the reference signal. The input signal is counted in a tooth counter, and the reference signal is counted in two counters including an interval counter and a vernier counter. The tooth counter is reset at the start of the counting interval, and is sampled or latched at the end of the counting interval. The vernier counter is reset at the start of each input signal cycle and is sampled or latched twice, when the tooth counter is reset and also when the tooth counter is latched. The interval counter is enabled for counting when the tooth counter is reset and is disabled for counting when the tooth counter is sampled or latched. The division takes place and all of the counters are reset in response to a maximum interval counter which counts a predetermined number of counting interval cycles. The latched value of the tooth counter is divided by additions and subtractions of the interval counter value and the latched values of the vernier counter to generate a value proportional to the speed of the rotating element.

SUMMARY OF THE INVENTION

The general aim of the invention is to provide a frequency sensor for obtaining a compact but high-resolution and wide-range digital representation of the frequency of an input signal.

Another object of the invention is to provide a wide-range and high-resolution computer-sensor interface which requires as few input-output lines as possible and requires little software and execution-time overhead.

A specific object of the invention is to provide a speed sensor for engines or turbines which represents speed over the wide range of typical operation with an accuracy of at least 0.1% using only sixteen binary bits for the representation.

BRIEF DESCRIPTION OF THE DRAWINGS

Other objects and advantages of the invention will become apparent upon reading the attached detailed description and upon reference to the drawings in which:

FIG. 1 is a schematic circuit diagram of an embodiment of the invention for digitally representing the period or frequency of an input signal in base-two scientific notation;

FIG. 2 is a timing diagram for the circuit of FIG. 1 illustrating operation for an in-range condition;

FIG. 3 is a timing diagram illustrating the operation of the FIG. 1 circuit for a period over-range condition;

FIG. 4 is a timing diagram illustrating the operation of the circuit in FIG. 1 for a period under-range condition;

FIG. 5 is a timing diagram illustrating the operation of the FIG. 1 circuit for an extreme period over-range condition;

FIG. 6 is a timing diagram illustrating the operation of the circuit in FIG. 1 for an extreme period under-range condition;

Figure 7:
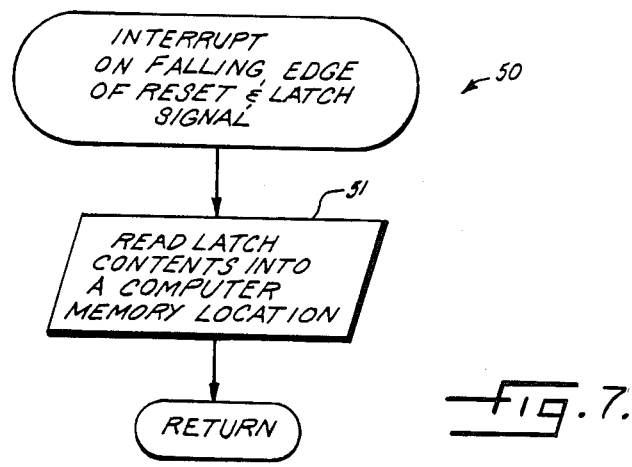
FIG. 7 is a flowchart of an interrupt subroutine for transferring data from the interface circuit of FIG. 1 to the memory of a computer.

While the invention has been described in connection with certain preferred embodiments, it will be understood that there is no intention to limit the invention to the particular embodiments shown, but it is intended, on the contrary, to cover the various alternative and equivalent forms of the invention included within the spirit and scope of the appended claims.

DESCRIPTION OF THE PREFERRED EMBODIMENTS

Turning now to the drawings, FIG. 1 shows a first embodiment of the present invention generally designated 20 for signaling in base-two scientific notation the relative period or frequency of a signal $\omega$ relative to a signal $\phi$. The circuit 20 uses synchronous digital logic components which are clocked by the signal $\phi$. The signal $\omega$ is synchronized to the signal $\phi$ by a standard synchronizer circuit generally designated 21 including delay flip-flops 22 and 23 and a logical AND-gate 24. The synchronizer 21 requires the frequency of $\omega$ to be less than half the frequency of $\phi$. Also, as set out further below, the frequency of $\phi$ determines the minimum sampling time at which the circuit 20 generates an updated digital representation of the relative period or frequency of $\omega$ with respect to $\phi$. These constraints usually dictate that $\omega$ is an input signal and $\phi$ is a reference signal having a fixed frequency, although in other situations consistent with the constraints above, the frequency of $\omega$ could be fixed and the frequency of $\phi$ could be the frequency to be determined. An example of such a situation is the counting of the frequency of events indicated by the signal $\phi$ over a relatively long counting interval specified by the signal $\omega$. This kind of event counting is used for sensing nuclear particles, radioactivity, or ionizing radiation. Alternatively, $\omega$ and $\phi$ could both be variable-frequency input signals.

The circuit 20 repetitively determines the relative period of $\omega$ with respect to $\phi$ and repetitively strobes a digital representation of the relative period into a latch 25. The latch 25 has tri-state outputs $Q_0$-$Q_{N+M+1}$ which are fed to a computer data bus 26. In order to transfer the value stored in the latch 25 to the computer's memory (not shown), an address decoder 27 receives the computer's address bus 28 including appropriate read/write and valid-memory-address signals. Upon receiving a valid address data equal to a predetermined address for reading data, the address decoder 27 generates an enabling signal fed to the output enable (OE) input of the latch 25. Therefore, the computer (not shown) can transfer data from the latch 25 to its memory (not shown) by performing a READ from the predetermined address of the address decoder 27 followed by a WRITE to the selected memory location to receive the data read from the latch. It is important, however, that the computer (not shown) does not read the latch 25 when the latch is being updated by the circuit 20. The updating of the latch 25 is performed in response to a RESET AND LATCH signal applied to the gate input (G) of the latch. Therefore, the computer (not shown) must perform a READ operation upon the latch 25 only in response to the RESET AND LATCH signal. For this purpose, the RESET AND LATCH signal is fed via a line 29 to the computer's interrupt input and/or to the computer's service request register (not shown).

As described above, the circuit 20 is useful for interfacing a sensor (not shown) which conveys information encoded as the frequency of $\omega$ to the computer (not shown). Therefore, the circuit 20 is especially useful for sensors such as speed sensors which inherently generate a frequency responsive to the physical property or characteristic being sensed. The circuit 20 is also useful for interfacing a typical analog sensor (not shown) to the computer (not shown). For transmitting analog signal over relatively long distances, the analog signals are typically converted to a frequency-modulated signal by a circuit called a voltage-to-frequency converter. In such cases, the circuit 20 in FIG. 1 is especially useful for receiving the frequency-modulated signal on its $\omega$ or $\phi$ input (depending on the range of frequencies generated by the sensor and voltage-to-frequency converter) and generating in the latch 25 a digital representation of the analog signal.

In control or monitoring systems having a number of sensors interfaced to the computer, it is especially desirable for a respective interface circuit 20 to provide a wide-range and high-resolution digital representation of each signal being sensed while at the same time requiring a minimum number of input-output lines to the computer's data bus 26 and requiring a minimum of software and execution-time overhead. By the term "wide-range" it is meant that the minimum and maximum frequencies to be represented are widely separated in frequency, for example, at least by an order of magnitude or a number of octaves. By "high-resolution" it is meant that within this wide range of frequency, the absolute precision of representation is a small fraction of the absolute frequency for all frequencies within the range, for example, on the order of 0.1% or one part per thousand.

The wide-range requirement and the high-resolution requirement are to some degree mutually inconsistent in the context of the fixed binary representation of numbers commonly used in the computer (not shown). A conventional binary counter, for example, has its highest resolution only when the most significant bit of its value is a logical one. It other words, the counter provides its highest resolution only over a narrow range of one octave. The resolution for the other octaves represented by the counter value, relative to the represented value, decreases in proportion to the represented value. This is a consequence of the fact that smaller values are represented by fewer numbers of bits, and the resolution is proportional to the number of significant bits in the representation. The binary number $11111111_2$, for example, has an absolute precision of $\pm 1$, but an absolute value of 255. The resolution, in other words, is 1/255 or approximately $2^{-8}$. In general, the resolution or relative precision of the binary fixed point representation is approximately $2^{-B}$, where B the number of binary bits in the binary number.

The deficiency of using a conventional binary counter having a limited number of stages for representing frequency or some other characteristic over a wide range is apparent upon consideration of what happens when such a counter has a limited number of stages and counts the reference frequency $\phi$ over a single cycle (time span $T_\omega$) of the input frequency $\omega$. In general, two problems arise. First, for very low input frequencies $\omega$ (when $T_\omega$ is long), the counter will all the way up to its maximum value and then roll over. Although roll-over could be prevented by inhibiting counting upon the occurrence of a carry-out ($C_{OUT}$), it is evident that the maximum value of the counter represents the minimum frequency $\omega$ that can be measured. Therefore, the resolution is limited by the number of counter stages and the number of output lines from these stages. Second, for very high input frequencies $\omega$ (when $T_\omega$ is short), the counter will not be able to count up very high during a single period, so that the resolution becomes very low.

In accordance with an important aspect of the present invention, the first problem of using a binary counter having a limited number of stages or output lines is solved by selectively dividing the reference frequency $\phi$ in response to the counter's value to obtain a clocking signal for the counter. In particular, the reference frequency $\phi$ is divided by an increasing number (I) for increasing counter values (L). Therefore, the counter has a nonlinear response to the reference frequency so that it does not "roll over" if the $\omega$ frequency has low values; such low values, where $t_{107}$ is long, are represented with increased absolute precision.

In accordance with another aspect of the present invention, the second problem of poor precision when the $\omega$ frequency is high and $T_\omega$ is short is solved by requiring that a certain minimum threshold counter value must always be reached before a numerical representation outputted.

These two important aspects of the invention are most clearly illustrated by the circuit 20 which comprises a counter generally designated 30 which counts the number of cycles of the reference frequency $\phi$ according to a base-two binary scientific representation.

As is well known, a number expressed in base-ten scientific notation includes a mantissa portion having a value greater than or equal to one and less than ten and an exponent portion such that the number to be represented is equal to the product of the mantissa and the number ten raised to the power of the exponent. Scientific notation is useful for representing numbers which range over many orders of magnitude. It is relatively easy, for example, to perform multiplications and divisions between numbers expressed in scientific notation. To perform a multiplication, for example, the exponent for the product is the sum of the exponents of the factors, and the mantissa of the product is the product of the mantissa of the factors. The exponent of the quotient is the difference between the exponent of the minuend and the exponent of the subtrahend, and the mantissa of the quotient is the quotient of the mantissa of the minuend and subtrahend. By using log tables, the multiplications and divisions are even more easily performed by adding and subtracting the logarithms of the mantissa for performing the multiplications and divisions, respectively.

By analogy to base-ten scientific notation, a number is expressed in base-two scientific notation as the product of a mantissa that is greater than or equal to one and less than two, and the number two raised to the power of the exponent. The prescribed range of the mantissa in base-two scientific notation insures that the portion of the mantissa to the left of the binary point includes a single binary digit or bit and this bit always has a value of one. Therefore, it is not necessary to transfer this bit from the circuit 20 to the computer since its value is known to the computer to be a logical one.

Returning to FIG. 1, the binary counter 30 includes a mantissa counter 31 for registering the portion of the mantissa to the right of the binary point, a J-K flip-flop 32 for registering the portion of the mantissa to the left of the binary point which always becomes set to one, and an exponent counter 33 for registering the exponent portion of the base-two scientific representation.

In accordance with the most basic method of the present invention, a clocking signal for the counter 30 is generated by dividing the reference frequency $\phi$ by a preselected number (I). For this purpose an adjustable frequency divider 34 is provided including a $\phi$ binary counter 35 clocked by the reference frequency $\phi$ and a multiplexer 36 having a select input receiving the magnitude of the exponent from the exponent counter 33 and having an output $Q_S$ being active when the carry-out occurs from a selected stage of the $\phi$ binary counter 35. When the exponent is zero, for example, the multiplexer selects a logical high (H) received on its $D_0$ input. When the exponent has a value of one, the multiplexer selects the carry-out from the first stage of the $\phi$ binary counter being received on the multiplexer input $D_1$. The carry-out from the first stage is merely the logical value $Q_0$ provided by the first stage. When the value of the exponent is two, the multiplexer selects the carry-out from the second stage $Q_1$ of the binary counter being received on the multiplexer input $D_2$. The carry-out from the second stage $Q_1$, however, is equal to the logical AND of the outputs of the first and second stages $Q_0$ and $Q_1$, respectively. The logical AND is provided by an AND-gate 37. In general, the carry-out of an arbitrary stage of the $\phi$ binary counter 35 is provided by the logical AND of the value provided by that stage and all of the previous stages. For this purpose, additional AND-gates generally designated 38 are wired in ripple fashion to each other and to the AND-gate 37. Of course, multiple input AND-gates could be used to provide the carry-out signals in the event that the rippling causes an objectionable time delay.

For the circuit 20, the exponent provided by the exponent counter 33 can have positive as well as negative values. To represent the negative as well as positive exponents, a twos-complement representation scheme has been selected in which all of the outputs $Q_0$-$Q_N$ of the exponent counter all have a value of logical one to represent the exponent of minus one. For negative exponent values, the incrementing signal to the counter 30 should be merely the reference frequency $\phi$, and for this purpose the input signal on the increment input (INC) of the mantissa counter 31 is provided by an OR-gate 39 which combines the output $Q_S$ of the multiplexer 36 with the sign bit $Q_N$ of the exponent counter 33.

Continuing with the basic method according to the invention, prior to counting during a clocking interval the counter 30 is preset. For the circuit 20, the mantissa counter 31, the J-K flip-flop 32, and the exponent counter 33 are all preset to zero values by a RESET AND LATCH signal which defines the counting interval. It should be noted that since the circuit 20 is entirely synchronous, the preset inputs (LDZ, K, LDZ) are all synchronous inputs. In other words, the mantissa counter 31, flip-flop 32, and exponent counter 33 are set to zero only upon an active transition of the $\phi$ signal. Also, it should be noted that that carry-out ($C_{OUT}$) of the mantissa counter 31 is internally gated by the increment input (INC) of the mantissa counter, and similarly the carry-in to the increment input (INC) of the exponent counter 33 is provided by an AND gate 40 requiring the increment input (INC) of the mantissa counter to be high as well as all of the mantissa counter outputs $Q_0$-$Q_M$ and the output Q of the J-K flip-flop 32. In this regard, the counter 30 differs from a conventional binary counter in that the counting stage for providing the most significant bit of the mantissa, is provided by the flip-flop 32 which is set to one by the carry-out ($C_{OUT}$) of the mantissa counter 31 and is reset only by the RESET AND LATCH signal. Also the exponent counter includes a decrement input (DEC) which is not used in connection with clocking in response to the $\phi$ reference frequency but which is used to record $\omega$ cycles as explained below with reference to FIGS. 4 and 6.

Still in accordance with the basic method of the present invention, the counter 30 is clocked by the clocking signal from the OR-gate 39 during the clocking interval established by the RESET and LATCH signal. When the exponent counter is zero, the counter 30 is incremented once for each cycle of the $\phi$ reference frequency. Counting continues until the mantissa counter 31 reaches its maximum count, whereupon its carry-out ($C_{OUT}$) becomes a logical one, thereby setting the flip-flop 32 on the next $\phi$ cycle.

As shown in the timing diagram of FIG. 2, the time for the mantissa counter 31 to set the flip-flop 32 is a time interval denoted $T_{MFS}$ and at the end of this interval the setting of the flip-flop generates an active LATCH & RESET PERMISSIVE signal. As noted below, the numerical contents must change (increase from zero) by at least a predetermined threshold value—necessary to produce a carry out from counter 31 and set flip-flop 31—before the counting can be terminated at the start of an $\omega$ signal. Only after the L. & R. P. enabling signal appears can the next $\omega$ signal produce a RESET AND LATCH signal which stores the numerical contents of counter 30 in the latch 25. Once the flip-flop 32 is set, a valid base-two scientific representation is present in the counter 30. An in-range condition as shown in FIG. 2 exists wherein the mantissa continues to count with the division ratio I still being one. When the mantissa counter again generates a carry-out ($C_{OUT}$), the AND-gate 40 is active thereby causing the exponent counter 33 to increment on the next cycle of the $\phi$ reference frequency. When the exponent counter 33 increments from zero to one, the number (I) representing the division ratio of the adjustable frequency divider 34 becomes set to two. In general, the number (I) is increased as a predetermined function of the value of the counter 30 in response to the value of the counter 30 deviating from its preset value. For the circuit 20 shown in FIG. 1, the adjustable frequency divider 34 is wired so that the division ratio (I) is doubled for each carry-out from counter 31 which increments the exponent counter 33. Thus, the division ratio (I) at any given time is equal to the number two raised by the power of the positive exponent registered by the exponent counter 33.

The operation of the adjustable frequency divider 34 and the exponent counter 33 is further illustrated in the timing diagrams of FIG. 3 and FIG. 5 for period overrange and the extreme period over-range conditions, respectively. In the period over-range condition of FIG. 3 the roll-over of the mantissa counter 31 when the flip-flop 32 is set is registered by a change in the value of the exponent counter 33 from zero to one and a change in the division ratio (I) from one to two. In the extreme period over-range condition, the exponent counter is incremented and the division ratio (I) is doubled each time the mantissa counter 31 rolls over.

As was noted above, a conventional binary counter has low resolution for low counter values when the $\omega$ signal has a relatively high frequency. To solve this problem for the period under-range condition, the counter 30 continues to count over more than one cycle of the $\omega$ signal until its value substantially deviates from its preset value. The clocking interval for the counter 30 is extended in length until after the counter 30 reaches some predetermined threshold value TH (i.e., until after counter 31 becomes full and flip-flop 32 is set) as indicated when the L. & R.P. signal goes to a logical as high. The number (J) of cycles of the $\omega$ signal during that extended interval is registered in a counter 41. To register the number (J), an $\omega$ binary counter 41 counts $\omega$ COUNT PULSES from the synchronizer 21 from time that the counter 30 is reset until after the (L. & R.P.) signal has been set to a logical high. For the circuit shown in FIG. 1, counting by the $\omega$ counter 41 is stopped in response to the counted number (J) registered by the counter 41 reaching its next higher integral power of two after the flip-flop 32 sets the LATCH & RESET PERMISSIVE signal to a logical high.

In order to determine when the number (J) of cycles of the $\omega$ signal reaches the next higher integral power of two, a multiplexer 42 selects the output of a respective stage of the $\omega$ binary counter 41 in response to the value of the exponent provided by the exponent counter 33. The data output $Q_S$ of the multiplexer 42 is fed via an OR-gate 44, a first AND-gate 45, and a second AND-gate 46, in order to generate when the next $\omega$ pulse wave front appears the RESET AND LATCH signal which marks the end of the counting interval, strobes the latch 25, and presets all of the counters for the next counting interval. Specifically, the inverter 43 and OR-gate 44 insure that the number (J) of $\omega$ cycles included in the counting interval is always one when the exponent counter 33 registers a positive exponent value (that is, when $Q_N$ of counter 33 is at a logic low). The AND-gate 45 insures that the counting interval always begins and ends at the very beginning of an $\omega$ cycle. The AND-gate 46 insures that the end of a counting interval always occurs when the LATCH & RESET PERMISSIVE signal is a logical high and therefore that the counter 30 has registered at least the predetermined number of counts TH necessary to fill the counter 31 and set the flip-flop 32, so that it indicates a valid base-two scientific representation.

In order to register the period under-range and extreme period under-range conditions as illustrated by the timing diagrams of FIGS. 4 and 6, when the output as of MUX 42 enables the AND-gate 45, a signal is fed to the decrement (DEC) input of the exponent counter 33. Further inspection of the timing diagrams in FIGS. 2-6 and close inspection of the corresponding state Tables 1-5 appended to the specification should verify to the reader that the circuit 20 in FIG. 1 generates a base-two scientific representation of the number of $\phi$ cycles included in an $\omega$ period. The state tables, for example, indicate that the mantissa counter 31, exponent counter 33, and $\phi$ binary counter 35 should all be preset to zero values, for example, by synchronous load-zero inputs (LDZ). The $\omega$ binary counter 41, however, should be preset via a synchronous parallel input ($P_{IN}$) and a synchronous load enable signal (LD) to a present value of one. Included along with the state tables are sample calculations converting the resulting base-two scientific representation to decimal values for the corresponding cases. The calculations illustrate that the base-two scientific representation gives the period of the $\omega$ signal in terms of the number of time units $T_{MFS}$, that is, the known period $T_\phi$ of the reference frequency multiplied by the number of counted pulses required to make the counter 31 reach its predetermined threshold value, or thereafter to roll over and increment the exponent counter 33.

The circuit 20 of FIG. 1 is somewhat unusual in that wholly synchronous latches and counters are used. Latch 25, for example, could be implemented by using standard TTL part number 74LS173 (gated latch having tri-state outputs). The mantissa counter 31 and the $\phi$ binary counter 35 could use TTL part number 74LS163 (counter with synchronous clear). The $\omega$ binary counter 41 and the exponent counter 33 could use TTL part number 74LS169 (binary up/down counter with synchronous load). If these TTL parts are used, the increment input (INC) of the mantissa counter 31 should be the T input to the counter so that the carry-out ($C_{OUT}$) is active only when the increment input (INC) is active. Also, the TTL part number 74LS169 includes a T or enable input and an up/down input rather than independent increment and decrement inputs. The increment signal (INC) for the exponent counter 33 should be fed to the up/down input for the TTL integrated circuit, and the logical OR of the increment (INC) and decrement (DEC) inputs to the exponent counter 33 should be fed to the T input of the TTL integrated circuit.

It is relatively easy to transfer the sampled data stored in the latch 25 to the computer memory and to use the data in the computer memory to perform numerical computations. Shown in FIG. 7 is a flowchart generally designated 50 for transferring the data from the latch to computer memory. The computer's interrupt capabilities are set up so that the interrupt routine 50 is executed upon the occurrence of a falling edge of the RESET & LATCH signal. The falling edge indicates that the data stored in the latch 25 will be stable for at least the time $T_{MFS}$ required for the mantissa counter 31 to first roll over in the next succeeding iteration of the iterated procedure. Upon occurrence of this falling edge, in step 51 the latch contents are read at the address programmed into the address decoder 27 and the contents of the latch 25 are transferred to a predetermined computer memory location. If a number of interface circuits 20 are used with one computer, it may be more efficient to have the RESET AND LATCH signals set respective bits of a service register (not shown), and to have the computer periodically look at the service register more frequently than the interval $T_{MFS}$ to determine which of the latches 25 should be read and their respective data transferred to memory during a service cycle. An alternative method of providing computer access to the latch 25 without contention is to delay or inhibit clocking of the latch when the computer is reading the contents of the latch. This alternative method is described further below in connection with FIGS. 12 and 13.

Preferably the latch 25 has a number (N+M+2) of outputs corresponding to the number of lines in the computer's data bus 26 to simplify address decoding and data transfer to the computer. Preferred values, for example, are M=3 and N=3 and 8-bit data bus, and M=11 and N=3 for a 16-bit data bus. In such cases both the mantissa and the exponent are simultaneously transferred from the latch 25 to a single computer memory location in step 51 of FIG. 7. For performing numerical calculations, however, the mantissa and the exponent are preferably placed and properly right or left justified in separate words of memory. In Tables 1–5, it is assumed that M=3 and N=3 and thus that there are M+1=4 binary stages in the mantissa counter 31. This makes the predetermined threshold value TH equal to 16 because sixteen $\phi$ cycles must be counted in the counter 31 before the flip-flop 32 sets to produce the L. & R.P. signal, which thereafter enables the next-appearing pulse to create the R. & L. signal vai gate 46. With N=3, the exponent counter 33 has N+1=4 binary stages, thus the latch 25 has a total of eight data inputs $D_0$ to $D_{n+M+1}=D_0$ to $D_7$ and eight outputs $Q_0-Q_7$ which connect to an eight bit computer data bus.

Figure 8:
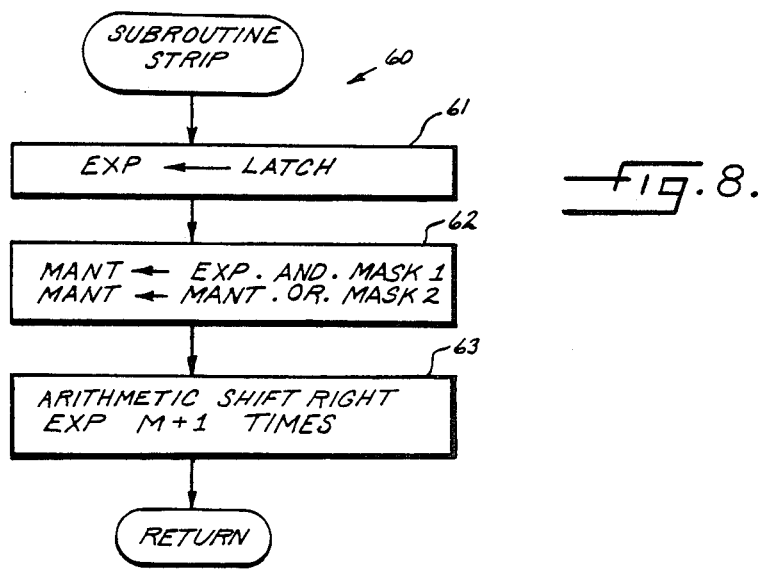
FIG. 8 is a flowchart of a subroutine for stripping the exponent and mantissa from the digital representation provided by the circuit of FIG. 1.
Figure 9:
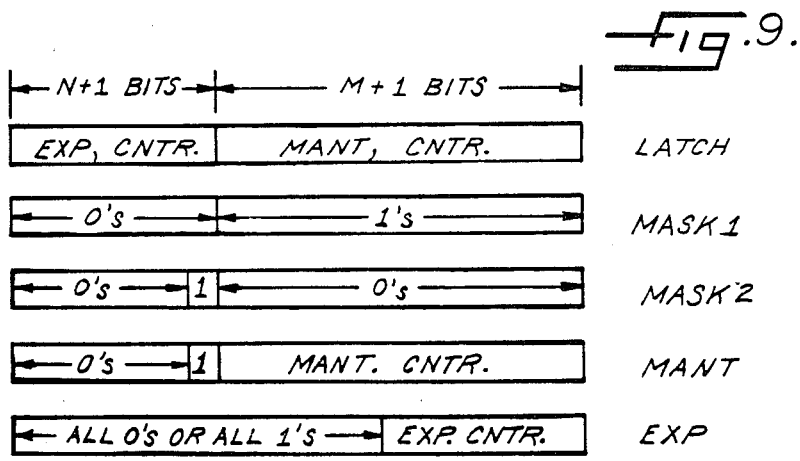
FIG. 9 is a diagram of the contents of the memory locations and masks referred to in the flowchart of FIG. 8.

Turning now to FIG. 8, there is shown a subroutine STRIP generally designated 60 which is provided for right justifying the exponent and mantissa in separate words of memory. In the first step 61 the memory location LATCH having received the contents of the latch in step 51 of FIG. 7 is transferred to a new memory location EXP which will eventually hold a right-justified value of the exponent from the exponent counter 33 shown in FIG. 1. A separate word MANT in memory eventually receives a right-justified value of the mantissa including the value from the mantissa counter 31 and the implicit logical one to the left of the binary point. Next in step 62, the value originally from the mantissa counter 31 is stripped from the value currently in the memory location EXP by a logical AND operation between the contents of EXP and a predetermined mask MASK1. As more specifically shown in FIG. 9, MASK1 has logical zeros corresponding to the location in EXP of the value originally from the exponent counter and logical ones corresponding to the location in EXP of the value originally from the mantissa counter. Also in step 62 the implicit logical one to the left of the binary point of the mantissa is placed in the proper bit position in the memory location MANT by a logical OR operation between the contents of the memory location MANT and a second predetermined mask MASK2. This second mask MASK2 includes logical zeros and a single logical one at the proper bit position of the mantissa. The resulting mantissa MANT is shown in FIG. 9. In a final step 63, the contents of the memory location EXP are arithmetically shifted right M+1 times in order to right justify the exponent value and in the process remove the mantissa value from the EXP memory location.

Figure 10:
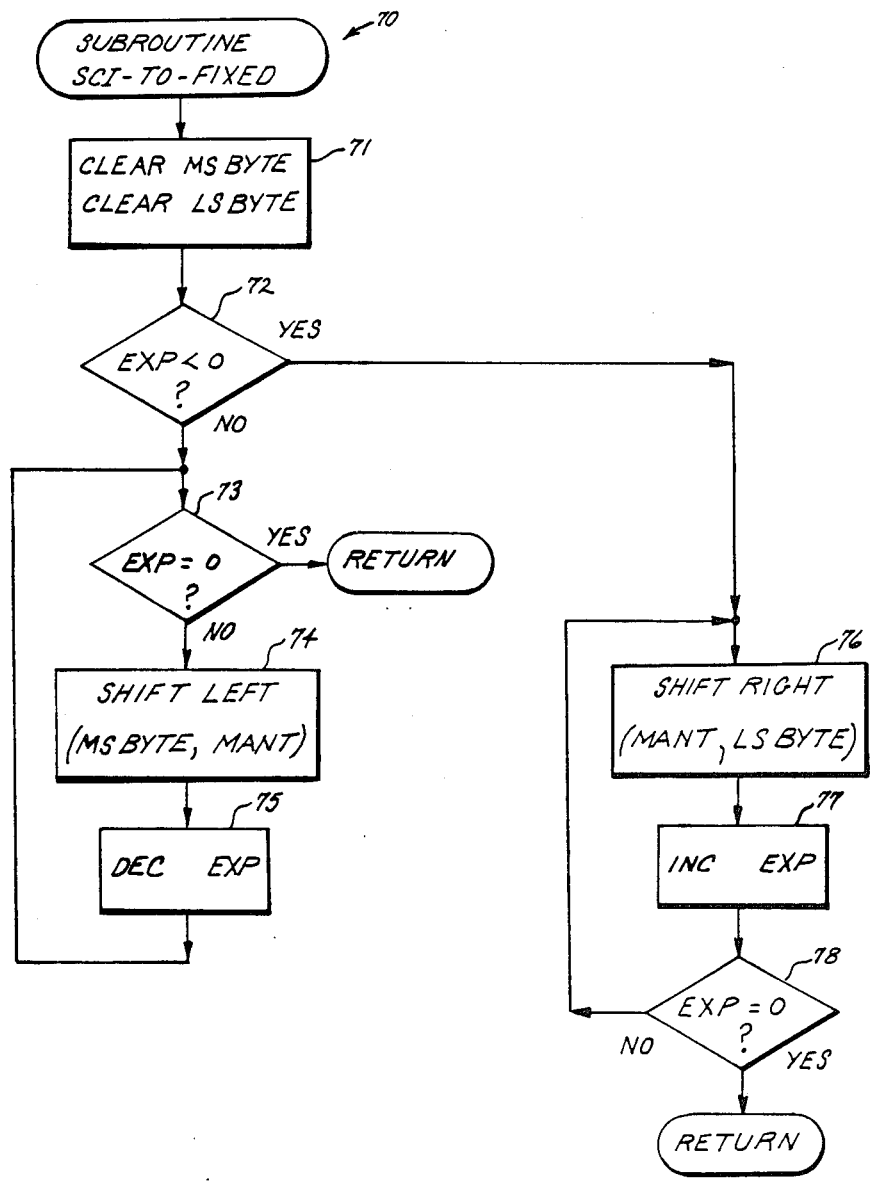
FIG. 10 is a flowchart of a subroutine for converting base-two scientific notation to base-two fixed representation.

The resulting mantissa MANT and exponent EXP as shown in FIG. 9 can then be used for numerical computations. These computations can be performed in scientific notation until it is necessary, for example for display purposes, to convert them to fixed representation. Conversion to fixed representation is easily performed for example according to the formula shown in Tables 1–5 and entails shifting the mantissa left or right, in response to whether the exponent is positive or negative, a number of binary places indicated by the absolute value of the exponent. A representative flowchart generally designated 70 is shown in FIG. 10. In the first step 71 a most significant byte or word MSBYTE and a least significant byte or word LSBYTE are cleared in anticipation of the resulting fixed representation occupying three bytes or words, including the most significant byte or word MSBYTE, the byte or word MANT, and the least significant byte or word LSBYTE. In step 72 the value of the exponent EXP is compared to zero. If the exponent is equal to zero, the combination of the most significant byte or word, the mantissa, and the least significant byte or word already is a proper fixed representation and in step 73 execution returns to the calling program (not shown). Otherwise, if the exponent is greater than zero, in step 74 the mantissa is shifted left one binary place with any overflow being shifted left into the most significant byte or word MSBYTE. Then in step 75 the exponent is decremented and exeuction returns to step 73. The shifting and decrementing continues until the exponent becomes zero and execution returns to the calling program. If in step 72 it was found that the exponents was negative, then in step 76 the mantissa is shifted right, with any overflow being right shifted into the least significant byte or word. In step 77 the exponent is incremented. Then in step 78 the exponent is compared to zero. If the exponent is zero, execution returns. Otherwise, execution jumps back to step 73 and the mantissa is successively shifted right and the exponent is successively incremented until the exponent is zero and execution returns to the calling program.

Figure 11:
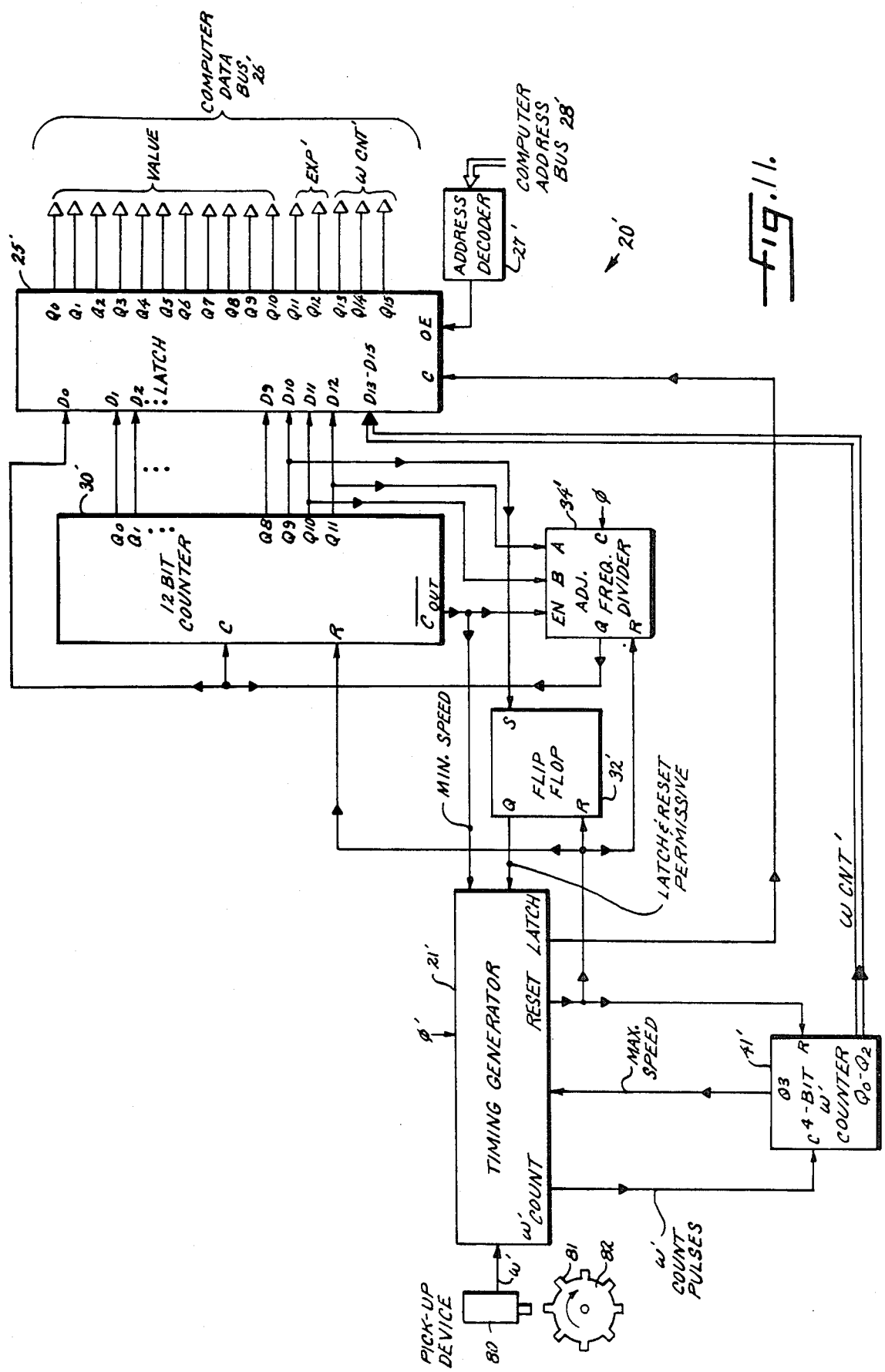
FIG. 11 is a block diagram of a preferred embodiment of the invention for speed sensing.

Turning now to FIG. 11, there is shown a block diagram of a preferred embodiment 20' of the present invention for use as an interface in a speed sensing system. In contrast to the circuit 20 in FIG. 1, the interface in FIG. 11 uses a number of asynchronous components. Asynchronous components may be preferred due to lower power consumption and lower cost. In contrast to the TTL parts which were suggested for the circuit of FIG. 1, the interface in FIG. 11 preferably uses standard CMOS parts having extremely low power consumption, as will be further described below in connection with FIGS. 12 and 13.

In order to generate a signal $\omega'$ having a frequency proportional to speed, a magnetic pickup device 80 senses the passing of individual teeth 81 on a gear 82 such as the gear on the flywheel of an engine. The pickup device 80, for example, is a coil or solenoid of wire about a magnetically permeable core including a permanent magnet. The teeth 81 of the gear 82 are made of a magnetically permeable material such as cast iron or steel so that the passage of an individual tooth causes a change in the magnetic flux through the coil of the pickup device 80, thereby inducing an alternating voltage in the coil at a frequency proportional to the rate at which the individual teeth 81 pass the pickup device 80. The frequency of the signal $\omega'$, in other words, is equal to the rotational frequency of the gear 82 multiplied by the number of teeth 81 on the gear. The signal $\omega'$ is fed to a timing generator 21' which is used in place of the synchronizer 21 of FIG. 1. The timing generator 21' generates $\omega'$ count pulses and also generates individual reset and latch signals. The circuit in FIG. 11, for example, uses an asynchronous latch 25' which is clocked by the latch signal just before the timing generator 21' generates a reset signal for presetting the counters and flip-flops in the circuit 20'.

Instead of using separate mantissa and exponent counters, a conventional 12-bit binary counter 30' is used to count cycles of a reference signal $\phi'$ in a nonlinear fashion. The most significant outputs $Q_{10}$ and $Q_{11}$ of the 12-bit counter 30' are fed to the select inputs A and B of an adjustable frequency divider 34' which generates a clocking signal on its Q output fed to the clock input of the 12-bit counter 30'. The clocking signal Q is also fed to the least significant input $D_0$ of the latch 25'. The minimum division ratio (I) of the frequency divider 34', in other words, is two, thereby in effect providing the first counting stage for counting the $\phi'$ cycles.

The circuit 20' also has a flip-flop 32' which is set when the 12-bit counter reaches a substantial threshold value TH indicated by its output $Q_9$ becoming a logical high. In contrast to the flip-flop 32 in the counter 30 of FIG. 1, the flip-flop 32' is not in the counter 30'. The counter 30', however, has a corresponding counting stage providing the output $Q_9$. The counting stage having the output $Q_9$, however, does not maintain a logic high output $Q_9$ once it is set to a high value. Due to the fact that this binary stage can toggle to a logic low, the value received in the latch 25' and appearing on the latch outputs $Q_0$-$Q_{10}$ is slightly different from the mantissa provided by the latch 25 in FIG. 1, although the latch outputs $Q_{11}$ and $Q_{12}$ provide a 2 bit exponent EXP'. The differences between the counter 30 in FIG. 1 and the counter 30' in FIG. 11 result in the circuit of FIG. 11 giving a constant offset if the value (VALUE) were assumed to be the same as the mantissa (with an implicit leading 1 to the left of the binary point) provided by the latch 25 in FIG. 1. Specifically, the number N of $\phi'$ cycles counted by the counter 30' of FIG. 11 is approximately:

$$N = (2^{EXP'})(2^{11} + VALUE) - 2^{11}.$$

In other words, the representation provided by the counter 30' differs from a scientific notation only by the constant offset of $2^{11}$. The flip-flop 32 in the circuit 20 of FIG. 1 could be considered as subtracting this constant offset since the mantissa counter 31 must roll over twice to first increment the exponent counter 33, but the exponent counter 33 is thereafter incremented once each time the mantissa counter 31 rolls over.

It should be noted that even after an adjustment for offset the scientific representation gives only an approximate value for the actual number (K) of clocking cycles that the counter 30 or 30' would receive if the division ratio (I) were not increased as an increasing function of the counted number (L) of the clocking cycles. This is a consequence of the fact that as division ratio (I) increases, an increasing number of $\phi$ or $\phi'$ cycles are required to change the value of the counter 30 or 30' by one count.

The value (VALUE) transmitted by the circuit 20' of FIG. 11 can be assumed to be a mantissa and the scientific representation can be processed as described above in connection with FIGS. 7-10, although a final subtraction operation is required to remove the offset and it must be recognized that the exponent EXP' provided by the circuit 20' is always positive. In addition, the output of the latch 25' must be masked to strip off the most significant bits $Q_{13}$-$Q_{16}$. These leading bits represent a three-bit unsigned value $\omega CNT'$ for the number (J) provided by an $\omega'$ counter 41' corresponding to the $\omega$ binary counter 41 shown in FIG. 1 but registered by decrementing the exponent counter 33. Since the exponent EXP' from the counter 30' is always positive, it is not responsive to a period under-range condition. Instead the period under-range condition or extreme under-range condition is indicated by the $\omega'$ counter value $\omega CNT'$ being different from one. In the event that $\omega CNT'$ is not one, the number of $\phi'$ cycles counted by the counter 30' and obtainable from the output VALUE and EXP' must be divided by $\omega CNT'$, the number of $\omega'$ cycles received in the counting interval, to determine the number of $\phi'$ cycles in a single $\omega'$ cycle. Stated another way, the relation is $T\omega = N/\omega CNT \times T\phi$ where N is the number of $\phi$ cycles (determined from VALUE and EXP) represented by the latched contents of counter 30', and $\omega CNT'$ is the quantity of $\omega$ cycles registered in the counter 41'. (If $\omega CNT'$ is zero, however, $\omega CNT'$ should be adjusted to eight, for the reason given below.) Alternatively, the value $\omega CNT'$ is divided by the number of $\phi'$ cycles counted during the counting interval to obtain the ratio of the frequency of $\omega'$ with respect to the frequency of $\phi'$.

The circuit in FIG. 11 also has a number of features not shown in the circuit of FIG. 1. The full count signal of the $\omega'$ counter 41' provided by the output $Q_3$ is fed to the timing generator 21' in order to generate a RESET AND LATCH signal upon the occurrence of a carry-out from stage $Q_2$. This is done to prevent an erroneous indication that would occur if the $\omega'$ counter 41' were to continue counting after having rolled over when the signal $\omega'$ has a particularly high frequency. Since $Q_3$ of the $\omega'$ counter 41' is not fed to the latch 25', eight $\omega'$ cycles have been counted when $\omega CNT'$ in the latch 25' has a value of zero. A similar goal could be achieved in the circuit 20 of FIG. 1 by inhibiting decrementing of the exponent counter 33 in the event that the value of the exponent counter is reduced to its minimum value of 10 ... $0_2$ (maximum registration of $\omega$ cycles). The circuit 20' in FIG. 11 also inhibits counting to prevent the 12 bit counter 30' from rolling over when the signal $\omega'$ has a particularly low frequency. For this purpose the carry-out ($C_{OUT}$) asserted low is fed to the enable input (EN) of the adjustable frequency divider 34'. A similar goal could be achieved in the circuit 20 of FIG. 1 by inhibiting incrementing of the exponent counter 33 in the event that the value of the exponent counter reaches its maximum value 01 ... 1$_2$.

Figure 12:
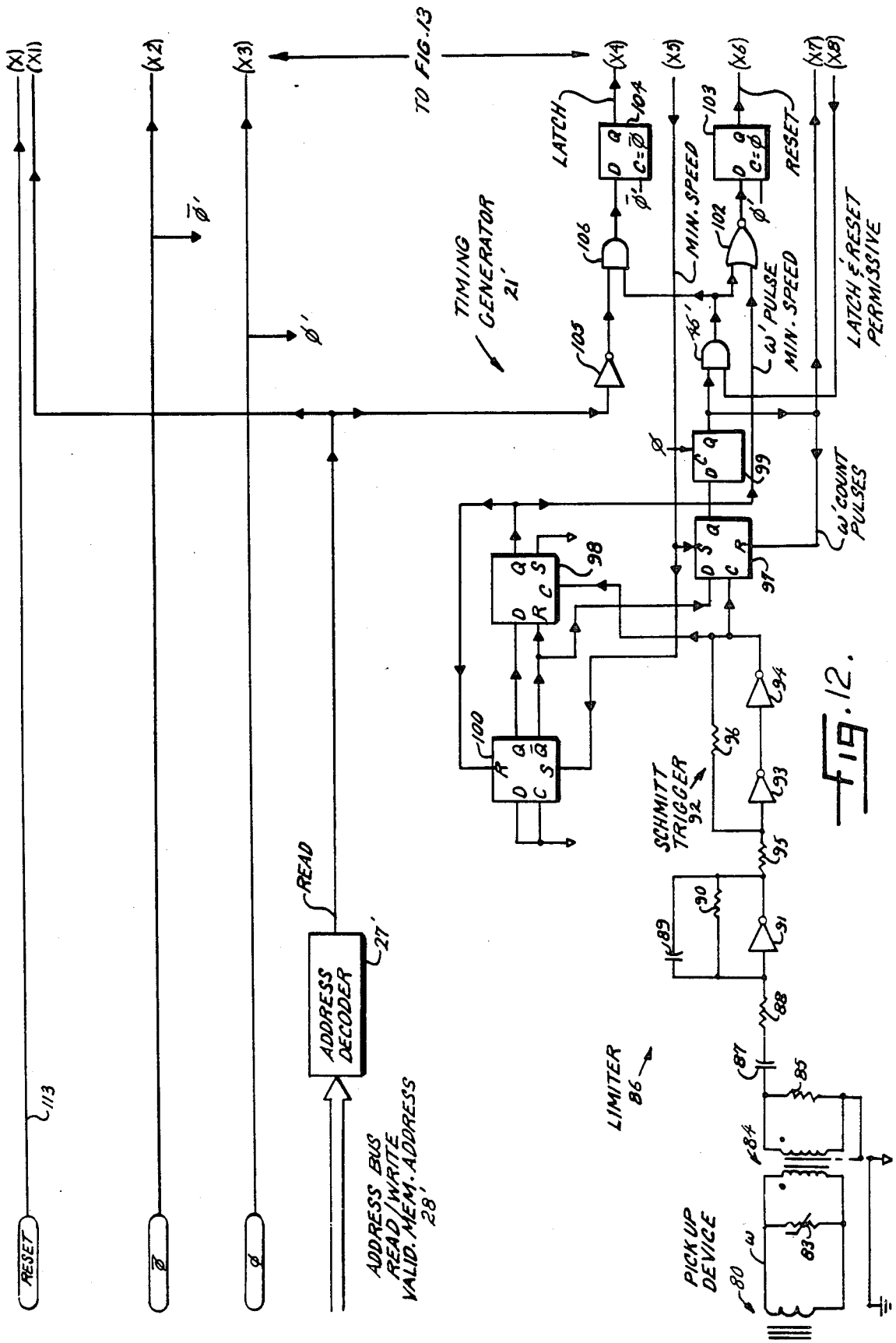
FIG. 12 is a first half of a schematic diagram of the preferred embodiment of the invention for speed sensing.
Figure 13:
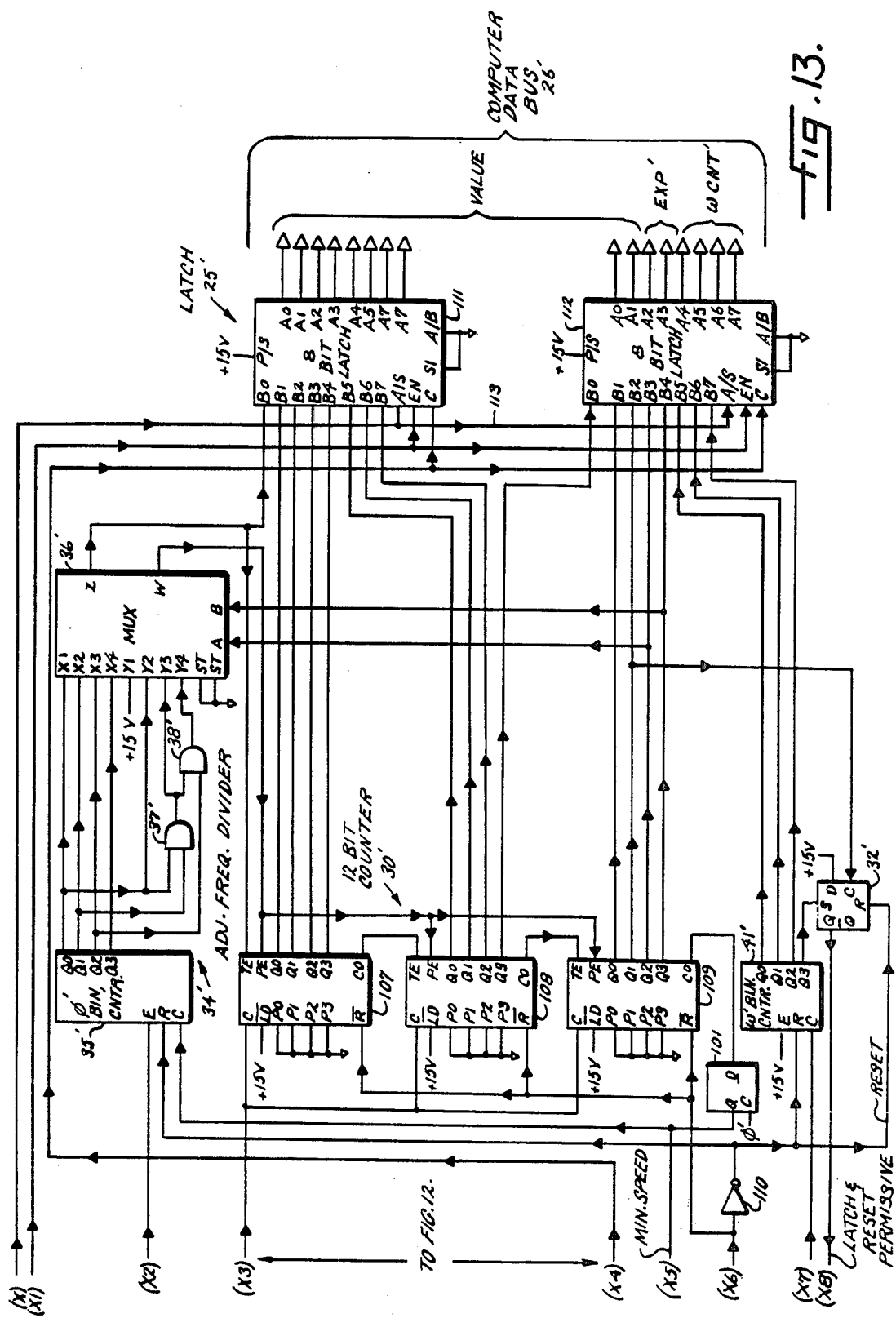
FIG. 13 is the second half of the schematic diagram of the preferred embodiment of the invention for speed sensing.

Turning now to FIGS. 12 and 13 there is shown a schematic diagram of a preferred circuit corresponding to the block diagram of FIG. 11. The ω' signal received from the pickup device 80 is stabilized in amplitude by a varistor 83 such as part number V68ZA2 and fed to the primary of an isolation transformer 84. The transformer's secondary is shunted by a resistor 85 having a typical value of 100K ohms and the signal from the secondary coil of the transformer 84 is fed to a limiter stage generally designated 86 which includes a series input capacitor 87, a series input resistor 88, a feedback capacitor 89, a feedback resistor 90, and an inverter 91. The inverter 91 is a CMOS part number of 4049, and the values of the input and feedback resistors and capacitors are chosen to pass the frequencies of interest, ranging from about 60 Hz to 15,000 Hz. Typical values are 0.01 microfarads, 100K ohms, 220 picofarads, and 301K ohms for the capacitor 87, resistor 88, capacitor 89 and resistor 90, respectively. The limited signal is fed to a Schmitt trigger 92 comprising two CMOS inverters 93 and 94, a series input resistor 95 and a positive feedback resistor 96. The inverters 93 and 94 are, for example, part number 4049 and the resistors 95 and 96 have typical values of 49.9K ohms and 150K ohms. The inverters 91, 93, and 94 should be included in the same integrated circuit so that they have the same threshold voltage levels. The output of the Schmitt trigger 92 from the inverter 94 clocks two delay flip-flops 97 and 98. The delay flip-flops are standard CMOS part number 4013. The flip-flops 97 and 98 cooperate in conjunction with similar delay flip-flops 99 and 100 in order to generate pulses on the ω' COUNT PULSES line when the MIN. SPEED signal is low, and to generate a pulse on the ω' PULSE MIN. SPEED line when the MIN. SPEED signal becomes high. The MIN. SPEED signal is generated from the carry-out of the last stage of the counter 30' after a delay provided by a delay flip-flop 101. In the normal case, a reset pulse is generated by an AND-gate 46' when the LATCH & RESET PERMISSIVE signal is high and an ω' COUNT PULSE signal is high. A reset pulse is also generated from the ω' PULSE MIN. SPEED signal in the atypical case of the speed being less than the minimum speed. A NOR-gate 102 such as CMOS part number 4001 and a delay flip-flop 103 generates a reset signal active low upon the occurrence of either of these two conditions. Upon a normal reset generated by the AND-gate 46', a latch signal is also generated by a delay flip-flop 104 just before the reset signal. For this purpose the flip-flop 104 is clocked by the complement of the φ' signal. The φ' and φ' complement signals are, for example, 2 MHz clock signals for the computer (not shown).

So that the computer may read the latch 25' at any given time, the READ signal from an address decoder 27' is used to inhibit the LATCH signal. When the READ signal is a logical high, an inhibit signal is generated by an inverter 105 and is fed to an AND-gate 106.

Continuing now on FIG. 13, the counter 30' includes three separate four-bit synchronous counters 107, 108, and 109 which are, for example, CMOS part number 40161. The adjustable frequency divider 34' includes a four-bit binary counter 35' such as CMOS part number 4520, AND-gates 37' and 38' such as part number 4081, and a dual four-bit multiplexer 36' such as part number 4539. The ω' binary counter 41' is, for example, also part number 4520. Since the part number 4520 requires an active high reset, the active low reset signal is inverted by an inverter 110 and fed to these counters. The reset active high signal is also fed to the flip-flop 32' which generates the LATCH & RESET PERMISSIVE signal.

The latch 25' is comprised of two eight-bit latches 111 and 112 such as CMOS part number 4034. These latches 111, 112 have tri-state outputs and the tri-state enable signal (EN) is activated by the READ signal from the address decoder 27'. The latches 111, 112 also have reset inputs (A/S) connected to the RESET line 113 from the microcomputer (not shown).

In view of the above, a circuit has been disclosed for obtaining a compact but high-resolution and wide-range digital representation of the frequency of an input signal. Using the circuit of FIG. 1, for example, a latch having 16 output lines can represent numerical frequency intelligence in base-two scientific notation having a four-bit exponent and a mantissa with 12 binary places, thereby providing a range of up to sixteen octaves or about five decades and a precision of at least one part in $2^{12}$ or 4096. This is a precision of about 0.025%. Moreover, as shown and described in connection with FIGS. 7–10, the circuit is easily interfaced to a computer and requires little software and little execution-time overhead. The circuit is especially advantageous for interfacing a speed sensor to a computer and a low-power CMOS circuit for this purpose has been shown and described in connection with FIGS. 12 and 13.

APPENDIX 1. STATE SEQUENCES FOR FIG. 1 CIRCUIT WITH M = 3, N = 3

TABLE 1

| | | IN-RANGE CONDITION [FIG. 2] | | | |
|---|---|---|---|---|---|
| φ CYC. | ω PUL. | L & RP. | L & R. | MCNT. | ECNT. |
| X | 1 | 1 | 1 | XXXX | XXXX |
| 0 | 0 | 0 | 0 | 0000 | 0000 |
| 1 | 0 | 0 | 0 | 0001 | 0000 |
| 2 | 0 | 0 | 0 | 0010 | 0000 |
| 3 | 0 | 0 | 0 | 0011 | 0000 |
| 4 | 0 | 0 | 0 | 0100 | 0000 |
| 5 | 0 | 0 | 0 | 0101 | 0000 |
| 6 | 0 | 0 | 0 | 0110 | 0000 |
| 7 | 0 | 0 | 0 | 0111 | 0000 |
| 8 | 0 | 0 | 0 | 1000 | 0000 |
| 9 | 0 | 0 | 0 | 1001 | 0000 |
| 10 | 0 | 0 | 0 | 1010 | 0000 |
| 11 | 0 | 0 | 0 | 1011 | 0000 |
| 12 | 0 | 0 | 0 | 1100 | 0000 |
| 13 | 0 | 0 | 0 | 1101 | 0000 |
| 14 | 0 | 0 | 0 | 1110 | 0000 |
| 15 | 0 | 0 | 0 | 1111 | 0000 |
| 16 | 0 | 1 | 0 | 0000 | 0000 |
| 17 | 0 | 1 | 0 | 0001 | 0000 |
| 18 | 0 | 1 | 0 | 0010 | 0000 |
| 19 | 0 | 1 | 0 | 0011 | 0000 |
| 20 | 0 | 1 | 0 | 0100 | 0000 |
| 21 | 0 | 1 | 0 | 0101 | 0000 |
| 22 | 0 | 1 | 0 | 0110 | 0000 |
| 23 | 0 | 1 | 0 | 0111 | 0000 |
| 24 | 0 | 1 | 0 | 1000 | 0000 |
| 25 | 0 | 1 | 0 | 1001 | 0000 |
| 26 | 0 | 1 | 0 | 1010 | 0000 |
| 27 | 0 | 1 | 0 | 1011 | 0000 |

TABLE 1-continued
IN-RANGE CONDITION [FIG. 2]

| φ CYC. | ω PUL. | L & RP. | L & R. | MCNT. | ECNT. |
|---|---|---|---|---|---|
| 28 | 1 | 1 | 1 | 1100 | 0000 |

LATCHED RESULT:
MCNT. = $1100_2$
ECNT. = $0000_2$
ω period = $(T_{MFS})*2**(ECNT.)*1.[MCNT.]_2$
= (16 φ cycles)$*2**(0)*1.1100_2$
= $16*1.1100_2$ φ cycles
= $10000_2*1.1100_2$ φ cycles
= $11100_2$ cycles
= 16 + 8 + 4 φ cycles
= 28 φ cycles

TABLE 2
PERIOD OVER-RANGE CONDITION [FIG. 3]

| φ CYC. | φ CNTR. | ω PUL. | L & RP. | L & R. | MCNT. | ECI. | ECNT. |
|---|---|---|---|---|---|---|---|
| X | XXXXXX | 1 | 1 | 1 | XXXX | X | XXXX |
| 0 | 000000 | 0 | 0 | 0 | 0000 | 0 | 0000 |
| 1 | 000001 | 0 | 0 | 0 | 0001 | 0 | 0000 |
| 2 | 000010 | 0 | 0 | 0 | 0010 | 0 | 0000 |
| 3 | 000011 | 0 | 0 | 0 | 0011 | 0 | 0000 |
| 4 | 000100 | 0 | 0 | 0 | 0100 | 0 | 0000 |
| . | . | . | . | . | . | . | . |
| 14 | 001110 | 0 | 0 | 0 | 1110 | 0 | 0000 |
| 15 | 001111 | 0 | 0 | 0 | 1111 | 0 | 0000 |
| 16 | 010000 | 0 | 1 | 0 | 0000 | 0 | 0000 |
| 17 | 010001 | 0 | 1 | 0 | 0001 | 0 | 0000 |
| 18 | 010010 | 0 | 1 | 0 | 0010 | 0 | 0000 |
| . | . | . | . | . | . | . | . |
| 30 | 011110 | 0 | 1 | 0 | 1110 | 0 | 0000 |
| 31 | 011111 | 0 | 1 | 0 | 1111 | 1 | 0000 |
| 32 | 100000 | 0 | 1 | 0 | 0000 | 0 | 0001 |
| 33 | 100001 | 0 | 1 | 0 | 0000 | 0 | 0001 |
| 34 | 100010 | 0 | 1 | 0 | 0001 | 0 | 0001 |
| 35 | 100011 | 0 | 1 | 0 | 0001 | 0 | 0001 |
| 36 | 100100 | 0 | 1 | 0 | 0010 | 0 | 0001 |
| . | . | . | . | . | . | . | . |
| 46 | 101110 | 0 | 1 | 0 | 0111 | 0 | 0001 |
| 47 | 101111 | 0 | 1 | 0 | 0111 | 0 | 0001 |
| 48 | 110000 | 1 | 1 | 1 | 1000 | 0 | 0001 |

LATCHED RESULT:
MCNT. = $1000_2$
ECNT. = $0001_2$
ω period = $(T_{MFS})*2**(ECNT.)*1.[MCNT.]_2$
= (16 φ cycles)$*2**(1)*1.1000_2$
= $10000_2*10_2*1.1000_2$ φ cycles
= $110000_2$ φ cycles
= 32 + 16 φ cycles
= 48 φ cycles

TABLE 3
PERIOD UNDER RANGE CONDITION [FIG. 4]

| φ CYC. | ω PUL. | L & RP. | L & R. | MCNT. | ECD. | ECNT. |
|---|---|---|---|---|---|---|
| X | 1 | 1 | 1 | XXXX | X | XXXX |
| 0 | 0 | 0 | 0 | 0000 | 0 | 0000 |
| 1 | 0 | 0 | 0 | 0001 | 0 | 0000 |
| 2 | 0 | 0 | 0 | 0010 | 0 | 0000 |
| 3 | 0 | 0 | 0 | 0011 | 0 | 0000 |
| 4 | 0 | 0 | 0 | 0100 | 0 | 0000 |
| 5 | 0 | 0 | 0 | 0101 | 0 | 0000 |
| 6 | 0 | 0 | 0 | 0110 | 0 | 0000 |
| 7 | 0 | 0 | 0 | 0111 | 0 | 0000 |
| 8 | 0 | 0 | 0 | 1000 | 0 | 0000 |
| 9 | 0 | 0 | 0 | 1001 | 0 | 0000 |
| 10 | 0 | 0 | 0 | 1010 | 0 | 0000 |
| 11 | 0 | 0 | 0 | 1011 | 0 | 0000 |
| 12 | 1 | 0 | 0 | 1100 | 1 | 0000 |
| 13 | 0 | 0 | 0 | 1101 | 0 | 1111 |
| 14 | 0 | 0 | 0 | 1110 | 0 | 1111 |
| 15 | 0 | 0 | 0 | 1111 | 0 | 1111 |
| 16 | 0 | 1 | 0 | 0000 | 0 | 1111 |
| 17 | 0 | 1 | 0 | 0001 | 0 | 1111 |
| 18 | 0 | 1 | 0 | 0010 | 0 | 1111 |
| 19 | 0 | 1 | 0 | 0011 | 0 | 1111 |
| 20 | 0 | 1 | 0 | 0100 | 0 | 1111 |
| 21 | 0 | 1 | 0 | 0101 | 0 | 1111 |
| 22 | 0 | 1 | 0 | 0110 | 0 | 1111 |
| 23 | 0 | 1 | 0 | 0111 | 0 | 1111 |
| 24 | 1 | 1 | 1 | 1000 | 0 | 1111 |

LATCHED RESULT:
MCNT. = $1000_2$
ECNT. = $1111_2$
ω period = $(T_{MFS})*2**(ECNT.)*1.[MCNT.]_2$
= (16 φ cycles)$*2**(-1)*1.1000_2$
= $10000_2*0.1_2*1.1000_2$ φ cycles
= $1100_2$ φ cycles
= 8 + 4 = 12 φ cycles

TABLE 4
EXTREME PERIOD OVER-RANGE CONDITION [FIG. 5]

| φ CYC. | φ CNTR. | ω PUL. | L & RP. | L & R. | MCNT. | ECI. | ECNT. |
|---|---|---|---|---|---|---|---|
| X | XXXXXX | 1 | 1 | 1 | XXXX | X | XXXX |
| 0 | 000000 | 0 | 0 | 0 | 0000 | 0 | 0000 |
| 1 | 000001 | 0 | 0 | 0 | 0001 | 0 | 0000 |

TABLE 4-continued

EXTREME PERIOD OVER-RANGE CONDITION [FIG. 5]

| φ CYC. | φ CNTR. | ω PUL. | L & RP. | L & R. | MCNT. | ECI. | ECNT. |
|---|---|---|---|---|---|---|---|
| 2 | 000010 | 0 | 0 | 0 | 0010 | 0 | 0000 |
| . | . | . | . | . | . | . | . |
| 15 | 001111 | 0 | 0 | 0 | 1111 | 0 | 0000 |
| 16 | 010000 | 0 | 1 | 0 | 0000 | 0 | 0000 |
| 17 | 010001 | 0 | 1 | 0 | 0001 | 0 | 0000 |
| . | . | . | . | . | . | . | . |
| 31 | 011111 | 0 | 1 | 0 | 1111 | 1 | 0000 |
| 32 | 100000 | 0 | 1 | 0 | 0000 | 0 | 0001 |
| 33 | 100001 | 0 | 1 | 0 | 0000 | 0 | 0001 |
| 34 | 100010 | 0 | 1 | 0 | 0001 | 0 | 0001 |
| 35 | 100011 | 0 | 1 | 0 | 0001 | 0 | 0001 |
| . | . | . | . | . | . | . | . |
| 62 | 111110 | 0 | 1 | 0 | 1111 | 0 | 0001 |
| 63 | 111111 | 0 | 1 | 0 | 1111 | 1 | 0001 |
| 64 | 000000 | 0 | 1 | 0 | 0000 | 0 | 0010 |
| 65 | 000001 | 0 | 1 | 0 | 0000 | 0 | 0010 |
| 66 | 000010 | 0 | 1 | 0 | 0000 | 0 | 0010 |
| 67 | 000011 | 0 | 1 | 0 | 0000 | 0 | 0010 |
| 68 | 000100 | 0 | 1 | 0 | 0001 | 0 | 0010 |
| 69 | 000101 | 0 | 1 | 0 | 0001 | 0 | 0010 |
| 70 | 000110 | 0 | 1 | 0 | 0001 | 0 | 0010 |
| 71 | 000111 | 0 | 1 | 0 | 0001 | 0 | 0010 |
| 72 | 001000 | 0 | 1 | 0 | 0010 | 0 | 0010 |
| . | . | . | . | . | . | . | . |
| 126 | 111110 | 0 | 1 | 0 | 1111 | 0 | 0010 |
| 127 | 111111 | 0 | 1 | 0 | 1111 | 1 | 0010 |
| 128 | 000000 | 0 | 1 | 0 | 0000 | 0 | 0011 |
| 129 | 000001 | 0 | 1 | 0 | 0000 | 0 | 0011 |
| 130 | 000010 | 0 | 1 | 0 | 0000 | 0 | 0011 |
| 131 | 000011 | 0 | 1 | 0 | 0000 | 0 | 0011 |
| 132 | 000100 | 0 | 1 | 0 | 0000 | 0 | 0011 |
| 133 | 000101 | 0 | 1 | 0 | 0000 | 0 | 0011 |
| 134 | 000110 | 0 | 1 | 0 | 0000 | 0 | 0011 |
| 135 | 000111 | 0 | 1 | 0 | 0000 | 0 | 0011 |
| 136 | 001000 | 0 | 1 | 0 | 0001 | 0 | 0011 |
| . | . | . | . | . | . | . | . |
| 151 | 010111 | 0 | 1 | 0 | 0010 | 0 | 0011 |
| 152 | 011000 | 1 | 1 | 1 | 0011 | 0 | 0011 |

LATCHED RESULT:
MCNT. = $0011_2$
ECNT. = $0011_2$
ω period = $(T_{MFS}) * 2^{**}(ECNT.) * 1.[MCNT.]_2$
= $(16 \phi \text{ cycles}) * 2^{**}(3) * 1.0011_2$
= $10000_2 * 1000_2 * 1.0011_2 \phi$ cycles
= $10011000_2 \phi$ cycles
= $128 + 16 + 8 = 152 \phi$ cycles

TABLE 5

EXTREME PERIOD UNDER-RANGE CONDITION [FIG. 6]

| φ CYC. | ω PUL. | L & RP. | L & R. | MCNT. | ω CNT. | ECD. | ECNT. |
|---|---|---|---|---|---|---|---|
| X | 1 | 1 | 1 | XXXX | XXXXXXXXX | X | XXXX |
| 0 | 0 | 0 | 0 | 0000 | 000000001 | 0 | 0000 |
| 1 | 1 | 0 | 0 | 0001 | 000000001 | 1 | 0000 |
| 2 | 0 | 0 | 0 | 0010 | 000000010 | 0 | 1111 |
| 3 | 1 | 0 | 0 | 0011 | 000000010 | 1 | 1111 |
| 4 | 0 | 0 | 0 | 0100 | 000000011 | 0 | 1110 |
| 5 | 0 | 0 | 0 | 0101 | 000000011 | 0 | 1110 |
| 6 | 1 | 0 | 0 | 0110 | 000000011 | 0 | 1110 |
| 7 | 0 | 0 | 0 | 0111 | 000000100 | 0 | 1110 |
| 8 | 1 | 0 | 0 | 1000 | 000000100 | 1 | 1110 |
| 9 | 0 | 0 | 0 | 1001 | 000000101 | 0 | 1101 |
| 10 | 1 | 0 | 0 | 1010 | 000000101 | 0 | 1101 |
| 11 | 0 | 0 | 0 | 1011 | 000000110 | 0 | 1101 |
| 12 | 1 | 0 | 0 | 1100 | 000000110 | 0 | 1101 |
| 13 | 0 | 0 | 0 | 1101 | 000000111 | 0 | 1101 |
| 14 | 1 | 0 | 0 | 1110 | 000000111 | 0 | 1101 |
| 15 | 0 | 0 | 0 | 1111 | 000001000 | 0 | 1101 |
| 16 | 0 | 1 | 0 | 0000 | 000001000 | 0 | 1101 |

TABLE 5-continued

| EXTREME PERIOD UNDER-RANGE CONDITION [FIG. 6] | | | | | | | |
|---|---|---|---|---|---|---|---|
| φ CYC. | ω PUL. | L & RP. | L & R. | MCNT. | ω CNT. | ECD. | ECNT. |
| 17 | 1 | 1 | 1 | 0001 | 000001000 | 1 | 1101 |

LATCHED RESULT:
MCNT. = $0001_2$
ECNT. = $1101_2$
ω period = $(T_{1/FS})*2^{**}(ECNT.)*1.[MCNT.]_2$
= (16 φ cycles)$*2^{**}(-3)*1.0001_2$
= $10000_2*0.001_2*1.0001_2$ φ cycles
= $10.001_2$
= $2\frac{1}{8}$ φ cycles

What is claimed is:

1. A method of digitally signaling the numerical value of the period (inverse of frequency) of a first signal with respect to the period of second signal, one of said signals being of constant frequency and the other being of unknown and changeable frequency, but the first signal ($\phi$) having a frequency several orders of magnitude greater than that of the second signal ($\omega$), said method comprising
   (a) feeding said first signal ($\phi$) to a counter so that the counter contents incrementally change in response to the first signal,
   (b) detecting when the contents of said counter have changed by at least a predetermined threshold amount TH after the beginning instant of a given cycle of said second signal ($\omega$) and producing an enabling signal (L. & R.P.) when the detection occurs,
   (c) storing the number n by which the contents of said counter have changed during the interval between the beginning instant of said given cycle and the beginning instant of a subsequent cycle of said second signal ($\omega$) which next begins after the appearance of said enabling signal,
   (d) registering the quantity $\omega$CNT of second signal cycles which occur during said interval, and
   (e) utilizing said stored number n and registered quantity $\omega$CNT according to the relation $$T_\omega = \frac{n}{\omega CNT} \cdot T_\phi$$

to determine one period ($T_{107}$ or $T_\phi$) with respect to the other period ($T_{100}$ or $T_\omega$).

2. The method defined in claim 1 further including
   (f) registering the quantity EXP of any roll-overs of said counter which may occur after said enabling signal has appeared but prior to the beginning of said subsequent cycle of said second signal ($\omega$),
   (g) increasing a division number I, by which said first signal ($\phi$) is divided before being fed to said counter in the execution of said step (a), as a function of the roll-overs EXP registered prior to the start of said subsequent cycle of said second signal ($\omega$).
   (h) executing said step (c) by storing not only said number n but also the registered quantity EXP of roll-overs at the beginning of said subsequent cycle, and
   (i) utilizing said stored numbers n and EXP to determine one period ($T_\omega$ or $T_\phi$) with respect to the other period ($T_\phi$ or $T_\omega$).

3. The method defined in claim 2 further characterized in that said division number I is increased by a power of two for each successive registered roll-over.

4. The method defined in claim 2 further characterized in that said counter contents are signaled in binary notation as a multibit word (MANT) and said roll-overs are registered and signaled in binary notation as a multibit word (EXP), and
   said step (i) includes utilizing said stored number n as a mantissa and said stored number EXP as an exponent to determine the quantity of first signal ($\phi$) cycles in one cycle of said second signal ($\omega$).

5. A method of digitally signaling the numerical value of the period (inverse of frequency) of a first signal with respect to the period of second signal, one of said signals being of constant frequency and the other being of unknown and changeable frequency, but the first signal ($\phi$) having a frequency several orders of magnitude greater than that of the second signal ($\omega$), said method comprising
   (a) resetting a counter to zero at the instant which coincides with the start of a given cycle of said second signal ($\omega$),
   (b) feeding said first signal ($\phi$) to the counter to incrementally increase the counter contents in response to the first signal,
   (c) storing the number n held in said counter at the instant which coincides with the start of a cycle, subsequent to said given cycle, of said second signal ($\omega$),
   (d) inhibiting execution of said step (c) unless and until the contents of said counter have risen to a predetermined numerical threshold value TH,
   (e) registering the quantity $\omega$CNT of second signal cycles which occur in the interval between the start of said given cycle and the start of said subsequent cycle when said step (c) is executed, and
   (f) utilizing said stored number n and registered quantity $\omega$CNT according to the relation $$T_\omega = \frac{n}{\omega CNT} \cdot T_\phi$$

to determine the period of one signal ($T_\omega$ or $T_\phi$) with respect to the known period of the other signal ($T_\phi$ or $T_\omega$).

6. The method defined in claim 5 further characterized in that
   the contents of said counter are sensed, while step (b) is in progress, to produce an enabling signal (L. & R.P.) when the contents number n is euqal to or greater than said predetermined threshold value TH, and
   said step (c) is executed only after said enabling signal is present.

7. The method defined in claim 5 further characterized in that
   said step (a) is initiated after each execution of said step (c), and the sequence of steps (a) through (f) is iterated, the cycle of said second signal which next begins following execution of step (c) in one iteration being the given cycle for the succeeding interation.

8. The method defined in claim 5 further characterized in that said predetermined threshold value TH is chosen in relation to the frequency of said first signal to make the resolution of the stored number n equal to a desired quality when the second signal (ω) has its shorter expected period $T_\omega$ in relation to the period $T_\phi$.

9. The method defined in claim 5 further characterized in that said step (e) is carried out by registering the quantity ωCNT of said second signal cycles as a negative exponent applied to said number n as a mantissa.

10. The method defined in claim 5 further characterized in that said step (e) is carried out by registering the quantity ωCNT in a second counter, and said step (f) includes transmitting said number n from the first-named counter and the number ωCNT from said second counter to signal processing apparatus.

11. The method set forth in claim 5 further characterized in that said step (f) includes converting said registering quantity ωCNT into an exponent value EXP applied to the counter number n as a mantissa MANT, and determining the period $T_\omega$ in relation to the period $T_\phi$ from a product of the minimum threshold value TH and the quantity represented in scientific notation by EXP and MANT.

12. The method set forth in claim 11 wherein step (d) is carried out by inhibiting execution of said step (c) unless and until (i) the contents of said counter have risen to a predetermined numerical threshold TH and (ii) the registered quantity ωCNT thereafter reaches an integral power of two.

13. The method set forth in claim 12 further characterized in that said quantity ωCNT is converted into an exponent EXP of two which makes the $2^{EXP}=\omega CNT$, and the EXP is treated as negative in the scientific notation.

14. The method defined by claim 5 further including
(g) registering in a second counter (ECNTR 33) the quantity EXP of any roll-overs which may occur after said counter contents have risen to said threshold value TH but prior to the start of the next cycle of the second signal following said given cycle,
(h) dividing the frequency of said first signal (φ) by a changeable number I for feeding to said counter,
(i) increasing said number I as a function of the quantity EXP signaled by said second counter,
(j) executing said step (c) by storing not only said number n but also said registered quantity EXP which exist at the beginning of said next cycle of the second signal,
(k) and utilizing both of the stored numbers n and EXP to determine one period ($T_\omega$ or $T_\phi$) with respect to the other period ($T_\phi$ or $T_\omega$).

15. The method defined in claim 14 further characterized in that said step (i) is carried out by
(i') increasing said number I by a power of two according to changes in the registered quantity EXP such that $I=2^{EXP}$ and the division number is doubled in response to each roll-over.

16. The method defined by claim 15 further characterized in that said counter and said second counter are binary counters, and the total quantity of first signal (φ) cycles occurring during one cycle of said second signal (ω) is determined by treating said number n as a mantissa MANT qualified by said number EXP as an exponent.

17. The method defined by claim 16 further characterized in that said threshold value TH is the number required for said first counter to roll over, the first roll-over of said counter is not registered in said second counter, and the total quantity of first signal (φ) cycles occurring in one cycle of said second signal (ω) is determined as the product $$T_\omega = TH \times 2^{EXP} \times 1.MANT.$$

18. In apparatus for digitally signaling the numerical value of the period (inverse of frequency) of a first recurring signal with respect to the period of a second recurring signal, one of said signals being of constant frequency and the other being of unknown and changeable frequency, but the first signal (φ) having a frequency several orders of magnitude greater than that of the second signal (ω), the combination comprising
(a) a first counter (31) and means for applying said first signal (φ) thereto for counting therein,
(b) means responsive to output signals from said counter for detecting when the contents of said counter have changed by a predetermined amount TH after the beginning instant of a given cycle of said second signal (ω) and producing an enabling signal (L. & R.P.) when the detection occurs,
(c) means actuated by said second signal (ω) for storing the number n by which the contents of said counter have changed in the interval between the beginning instant of said given cycle and the beginning instant of a subsequent cycle of said second signal which next begins after the appearance of said enabling signal,
(d) means responsive to said second signal (ω) for registering the quantity ωCNT of second signal cycles which occur during said interval, and
(e) means reponsive to said stored number n and said registered quantity ωCNT for computing one period ($T_\omega$ or $T_\phi$) with respect to the other period ($T_\phi$ or $T_\omega$) according to the relation $$T_\omega = \frac{n}{\omega CNT} \cdot T_\phi.$$

19. The combination set forth in claim 18 further characterized in that
(d') said means (d) includes a second counter (33) which registers the quantity ωCNT of second signal cycles as a number EXP which makes $2^{EXP}$ equal to ωCNT and $2^{-EXP}$ equal to 1/ωCNT,
(c') said means (c) includes means for storing said number n at the beginning instant of said subsequent cycle which occurs when the quantity ωCNT is an integral power of two, and for also then storing the output EXP of said second counter,
(a') said counter (31) signals its output in binary notation, and
(e') said means (e) includes means responsive to said stored number n treated as a mantissa MANT and the stored number EXP as an exponent according to the relation $$T_\omega = TH \times 2^{-EXP} \times 1.MANT.$$

20. The combination set forth in claim 18 further including
(f) a second counter (33) and means for registering therein a count of any roll-overs of said first counter which may occur after said enabling signal has appeared but prior to the beginning of a second cycle, next-following said given cycle, of said second signal ($\omega$),
(g) means for frequency dividing said first signal ($\phi$) by a preselected division number I before application to said first counter,
(h) means responsive to said second counter for increasing said division number I as a function of roll-overs registered prior to the start of said second cycle of said second signal ($\omega$), and
(c') said means (c) including means for storing a number EXP by which the contents of said second counter (33) have changed during said interval.

21. The combination defined by claim 20 further characterized in that
(h') said means (h) is constituted by means for increasing said divisiion number I as a power of two for each successive roll-over registered in said second counter (33).

22. The combination defined by claim 20 further characterized in that
said first and second counters are binary counters which produce multi-bit output signals numerically representing their contents in binary notation,
(c') said means (c) includes means for storing a number EXP by which the contents of said second counter have changed during said interval,
and further including
(i) means responsive to the stored number n treated as a mantissa MANT and responsive to the stored number EXP treated as a qualifying exponent for determining the quantity of first signal ($\phi$) cycles in one cycle of said second signal ($\omega$).

23. In apparatus for digitally signaling the numerical value of the period (inverse of frequency) of a first recurring signal with respect to the period of a second recurring signal, one of said signals being of constant frequency and the other being of unknown and changeable frequency, but the first signal ($\phi$) having a frequency several orders of magnitude greater than that of the second signal ($\omega$), the combination comprising
(a) a first counter (31),
(b) a second counter (33),
(c) means for resetting said first and second counters at the instant which coincides with the start of a given cycle of said second signal ($\omega$),
(d) means for feeding said first signal ($\phi$) to the first counter for counting therein,
(e) means for storing the number n held in said first counter at the instant which coincides with the start of a cycle, subsequent to said given cycle, of said second signal ($\omega$),
(f) means for disabling said means (e) unless and until an enabling signal appears,
(g) means for producing said enabling signal when and after the contents of said first counter have risen to a predetermined threshold value TH,
(h) means for feeding said second signal ($\omega$) to said second counter to count therein the quantity $\omega$CNT of second signal cycles which occur in the interval between the start of said given cycle and the start of said subsequent cycle, and
(i) means responsive to said stored number n and the counted number $\omega$CNT for computing the period of one signal ($T_\omega$ or $T_\phi$) with respect to the known period of the other signal ($T_\phi$ or $T_\omega$) according to the relation $$T_\omega = \frac{n}{\omega CNT} \cdot T_\phi.$$

24. The combination set forth in claim 23 further including
(j) means responsive to completion of the storing by said means (e) for actuating said means (c) so that the operation of the apparatus continues in iterated sequences, the cycle of said second signal ($\omega$) which next begins when said means (c) stores said number n for one iteration being the given cycle for the next iteration.

25. The combination defined by claim 23 further characterized in that said predetermined threshold value TH is chosen in relation to the frequency of said first signal ($\phi$) to make the resolution of the stored number n at least equal to a desired quality when the second signal ($\omega$) has its shortest expected period $T_\omega$ in relation to the period $T_\omega$.

26. The combination defined in claim 23 further characterized in that
said first and second counters are multi-stage binary counters (31 and 33),
(h') said means (h) include means for feeding said second signal ($\omega$) to said second counter to make it signal the value of $\omega$CNT as the numerical exponent EXP which makes $2^{EXP}$ equal to $\omega$CNT, and
(i') said means (i) responds to said stored number n as a mantissa qualified by an exponent which is $\omega$CNT=$2^{EXP}$.

27. The combination defined by claim 23 further characterized in that
(h') said means (h) causes said second counter to count said second signal cycles such that the second counter contents represent a negative exponent $-$EXP of a value which satisfies the equation $2^{-EXP}=1/\omega CNT$, where $\omega$CNT is the quantity of second signal cycles which occur in said interval.

28. The combination set forth in claim 23 further including
(j) means for converting said count $\omega$CNT registered in said second counter into a signaled value $-$EXP which satisfies the equation $2^{-EXP}=1/\omega CNT$, and
(k) means for preventing operation of said storing means (e) unless and until the counted value $\omega$CNT is equal to an integral power of 2,
whereby said means (i) may operate to compute the period of one signal ($T_\omega$ or $T_\phi$) relative to the period of the other signal ($T_\phi$ or $T_\omega$) according to the relation $$T_\omega = 2^{-EXP} \cdot n \cdot T_\phi.$$

* * * * *